United States Patent
Abali et al.

(10) Patent No.: US 9,940,191 B2
(45) Date of Patent: *Apr. 10, 2018

(54) CONCURRENT ERROR DETECTION IN A TERNARY CONTENT-ADDRESSABLE MEMORY (TCAM) DEVICE

(71) Applicant: International Business Machines Corporation, Armonk, NY (US)

(72) Inventors: Bulent Abali, Tenafly, NJ (US); Bartholomew Blaner, Underhill Center, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 145 days.

This patent is subject to a terminal disclaimer.

(21) Appl. No.: 14/948,273

(22) Filed: Nov. 21, 2015

(65) Prior Publication Data
US 2016/0283317 A1 Sep. 29, 2016

Related U.S. Application Data

(63) Continuation of application No. 14/672,128, filed on Mar. 28, 2015, now Pat. No. 9,606,861.

(51) Int. Cl.
*G11C 29/00* (2006.01)
*G06F 11/10* (2006.01)
(Continued)

(52) U.S. Cl.
CPC ...... *G06F 11/1004* (2013.01); *G06F 11/1064* (2013.01); *H03M 13/09* (2013.01); *H03M 13/096* (2013.01); *H03M 13/6318* (2013.01)

(58) Field of Classification Search
CPC .................. G06F 11/1004; H03M 13/096
See application file for complete search history.

(56) References Cited

U.S. PATENT DOCUMENTS 6,870,749 B1 3/2005 Park
6,879,504 B1 4/2005 Lien
(Continued)

FOREIGN PATENT DOCUMENTS

WO WO2010119381 10/2010

OTHER PUBLICATIONS

Bremler-Barr et al, PEDS: A Parallel Error Detection Scheme for TCAM Devices. IEEE/ACM Transactions on Networking, vol. 18, No. 5, p. 1665-1675, Oct. 2010.
(Continued)

*Primary Examiner* — Sam Rizk
(74) *Attorney, Agent, or Firm* — Jennifer R. Davis; Otterstedt, Ellenbogen & Kammer, LLP

(57) ABSTRACT

A plurality of data words are written into a TCAM; each has binary digits and don't-care digits. Contemporaneously, for each of the words: a first checksum is calculated on the binary digits; and the following are stored in a corresponding portion of a RAM: an identifier of the binary digits and the first checksum. The ternary content-addressable memory is queried with an input word. Upon the querying yielding a match, further steps include retrieving, from the random-access memory, corresponding values of the identifier of the binary digits and the first checksum; computing a second checksum on the input word, using the identifier of the binary digits; and if the second and first checksums are not equal, determining in real time that the match is a false positive.

19 Claims, 5 Drawing Sheets

(51) Int. Cl.
*H03M 13/09* (2006.01)
*H03M 13/00* (2006.01)

(56) References Cited

U.S. PATENT DOCUMENTS

| | | | |
|---|---|---|---|
| 6,987,684 | B1 | 1/2006 | Branth |
| 7,243,290 | B2 | 7/2007 | Slavin |
| 7,254,748 | B1 | 8/2007 | Wright |
| 7,257,672 | B2 | 8/2007 | Shoham |
| 7,305,519 | B1 | 12/2007 | Nagaraj |
| 7,594,158 | B2 | 9/2009 | Wickeraad |
| 7,689,889 | B2 | 3/2010 | Cohen |
| 7,924,588 | B2 | 4/2011 | Arsovski |
| 8,176,388 | B1 | 5/2012 | Moshe |
| 8,245,079 | B2 | 8/2012 | Hughes |
| 2004/0236903 | A1* | 11/2004 | Wakimoto ............ G11C 15/00 711/108 |
| 2008/0273362 | A1* | 11/2008 | Srinivasan ............ G11C 15/04 365/49.17 |
| 2011/0173386 | A1 | 7/2011 | Milliken |
| 2012/0110411 | A1 | 5/2012 | Cheung et al. |
| 2013/0058145 | A1 | 3/2013 | Yu |
| 2013/0136127 | A1 | 5/2013 | Hill |

OTHER PUBLICATIONS

S. Pontarelli, M. Ottavi, A. Salsano, Error Detection and Correction in Content Addressable Memories. This research was partially funded by the Italian Ministry for University and Research and by DEMONS, a research project supported by the European Commission under its 7th Framework Program Apr. 23, 2001, pp. 1-15.

Sriram C. Krishnan, Rina Panigrahy, and Sunil Parthasarathy, Error-Correcting Codes for Ternary Content Addressable Memories. Sep. 26, 2008 IEEE Transactions on Computers, vol. 58, No. 2, Feb. 2009, pages.

H.-J. Lee, Immediate soft error detection using pass gate logic for content addressable memory, Published Jul. 2012, Electronics Letters Feb. 14, 2008 vol. 44 No. 4 pp. 1-2.

Hideyuki Noda, Katsumi Dosaka, Fukashi Morishita and Kazutami Arimoto, A Soft-Error-Immune Maintenance-Free TCAM Architecture with Associated Embedded DRAM. Sep. 2005, IEEE 2005 Custom Integrated Circuits Conference, pp. 451-454.

Deflate, downloaded from http://en.wikipedia.org/wiki/DEFLATE on Mar. 19, 2015, pp. 1-9.

P. Deutsch DEFLATE Compressed Data Format Specification version 1.3, May 1996, Downloaded from http://tools.ietf.org/html/rfc1951 on Mar. 19, 2015, pp. 1-34.

Y. Tsiatouhas et al., "A hierarchical architecture for concurrent soft error detection based on current sensing", 2002 IEEE, pp. 1-5, Proceedings of the Eighth IEEE International On-Line Testing Workshop.

Bulent Abali et al., unpublished U.S. Appl. No. 14/672,128, filed Mar. 28, 2015, Concurrent Error Detection in a Ternary Content-Addressable Memory (TCAM) Device, pp. 1-31 plus 5 sheets drawings.

List of IBM Patents or Applications Treated as Related.

* cited by examiner

| TCAM 302 | RAM 304 | | |
|---|---|---|---|
| DATA | K | E | J |
| 0xxxxxxxxxxxxxxx | 1 | 0 | 0 |
| 10xxxxxxxxxxxxxx | 2 | 1 | 1 |
| 110xxxxxxxxxxxxx | 3 | 0 | 2 |
| 111xxxxxxxxxxxxx | 3 | 1 | 3 |

*FIG. 3*

CONCURRENT ERROR DETECTION IN A
TERNARY CONTENT-ADDRESSABLE
MEMORY (TCAM) DEVICE

CROSS-REFERENCE TO RELATED
APPLICATION

This application is a continuation of U.S. patent application Ser. No. 14/672,128 filed 28 Mar. 2015, the complete disclosure of which is expressly incorporated herein by reference in its entirety for all purposes.

FIELD OF THE INVENTION

The present invention relates to the electrical, electronic and computer arts, and, more particularly, to computer storage and the like.

BACKGROUND OF THE INVENTION

In standard computer memory (random access memory or RAM), the user supplies a memory address and the RAM returns the data word stored at that address. In content-addressable memory, or CAM, the user supplies a data word and the CAM searches its entire memory to see if that data word is stored anywhere therein. If so, the CAM returns a list of the storage address(es) where the word was found (and in some architectures, it also returns the data word, or other associated pieces of data).

Binary CAM is the simplest type of CAM; it employs data search words including only ones and zeroes. Ternary CAM (TCAM) allows a third matching state of "don't care" for one or more bits.

The article "PEDS: A Parallel Error Detection Scheme for TCAM Devices" by Anat Bremler-Barr et al., IEEE/ACM TRANSACTIONS ON NETWORKING, VOL. 18, NO. 5, October 2010, 1665-75 discloses an off-line (non-concurrent) error detection scheme.

SUMMARY OF THE INVENTION

Principles of the invention provide techniques for concurrent error detection in a TCAM device. In one aspect, an exemplary method includes the step of writing a plurality of data words into a ternary content-addressable memory. Each of the data words has binary digits and don't-care digits. A further step includes, contemporaneous with the writing, for each of the plurality of data words: calculating a first checksum on the binary digits; and storing, in a corresponding portion of a random-access memory: an identifier of the binary digits of the corresponding one of the data words; and the first checksum for the corresponding one of the data words. A still further step includes querying the ternary content-addressable memory into which the plurality of data words have been written with an input word. An even further step includes, upon the querying yielding a match: retrieving, from the random-access memory, corresponding values of the identifier of the binary digits and the first checksum; computing a second checksum on the input word, using the identifier of the binary digits; and if the second and first checksums are not equal, determining in real time that the match is a false positive.

In another aspect, an exemplary apparatus includes a ternary content-addressable memory array; a random access memory array; a loader coupled to the ternary content-addressable memory array and the random access memory array; a querying entity coupled to the ternary content-addressable memory array; and a matching logic module coupled to the random access memory array. The loader is configured to write a plurality of data words into the ternary content-addressable memory array, each of the data words having binary digits and don't-care digits. The loader is also configured to, contemporaneous with the writing, for each of the plurality of data words: calculate a first checksum on the binary digits; and store, in a corresponding portion of the random-access memory array: an identifier of the binary digits of the corresponding one of the data words and the first checksum for the corresponding one of the data words. The querying entity is configured to query the ternary content-addressable memory into which the plurality of data words have been written with an input word. The matching logic module is configured to, upon the querying yielding a match: retrieve from the random-access memory array corresponding values of the identifier of the binary digits and the first checksum; compute a second checksum on the input word, using the identifier of the binary digits; and, if the second and first checksums are not equal, determine in real time that the match is a false positive.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

At least a portion of one or more embodiments of the invention or elements thereof can be implemented in the form of a computer program product including a computer readable storage medium with computer usable program code for performing the method steps indicated. Furthermore, at least a portion of one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects; for example;
  ability to provide online (also referred to as concurrent or real-time) error detection on a TCAM;
  can be implemented with existing TCAM circuitry.

These and other features and advantages of the present invention will become apparent from the following detailed description of illustrative embodiments thereof, which is to be read in connection with the accompanying drawings.

BRIEF DESCRIPTION OF THE DRAWINGS

FIG. 3 shows a non-limiting example of codes and their corresponding symbols according to the format of FIG. 1;

DETAILED DESCRIPTION OF PREFERRED EMBODIMENTS

One or more embodiments advantageously provide concurrent error detection and/or correction for TCAMs. In one or more embodiments, multiple TCAM rows are searched in parallel. A single match wire per row, as in current techniques, makes it difficult (if not impossible) to carry out concurrent error detection and correction. Prior art techniques are thus limited to non-concurrent error detection; i.e., scrubbing TCAM memory in the background. Therefore, there is a chance of missing errors. Attempts to deal with this by using two TCAMs with duplicated content to detect any CAM/RAM (random access memory) errors and/or by using three TCAMs with triplicated content to detect and correct any CAM/RAM errors are expensive in terms of area and power.

Background error detection means that a scrubber process is continuously looking for errors in the TCAM array during idle cycles; it is not concurrent error detection. To facilitate background error detection, each TCAM word stores error detection bits, for example, a parity bit, a multi-bit cyclic redundancy check (CRC) code, or other error detection code. Assuming the ternary data bits of a TCAM word are each encoded with two binary bits such that a 0 is represented by storing the two bit binary code (0,1), a 1 is stored as (1,0), an X (don't care) is stored as (0,0) (the code (1,1) is unused), and a single parity bit is added to the word to facilitate single bit error detection on the ternary data bits, a single bit error in the parity scheme, a flip from zero to X (don't care) is detectable, as is a flip from one to X (don't care). However, a flip from zero to one is not detected, because that would mean a two-bit flip in a single truth table of a TCAM cell (i.e., (0,1)→(1,0)). Multiple bit errors may be detected in a CRC scheme. The scrubber looks for errors in all TCAM rows in parallel. For a TCAM array with N inputs, the scrubber can detect any single error in all TCAM rows after 2N queries in the TCAM array. Check digits are used in the scrubber queries. For normal TCAM operation, a check digit input will be supplied with X (don't care) to eliminate mismatches.

The aforementioned PEDS article provides an off-line (non-concurrent) error detection scheme. In contrast, one or more embodiments provide on-line error detection, i.e., concurrent with TCAM lookup.

Figure 1:
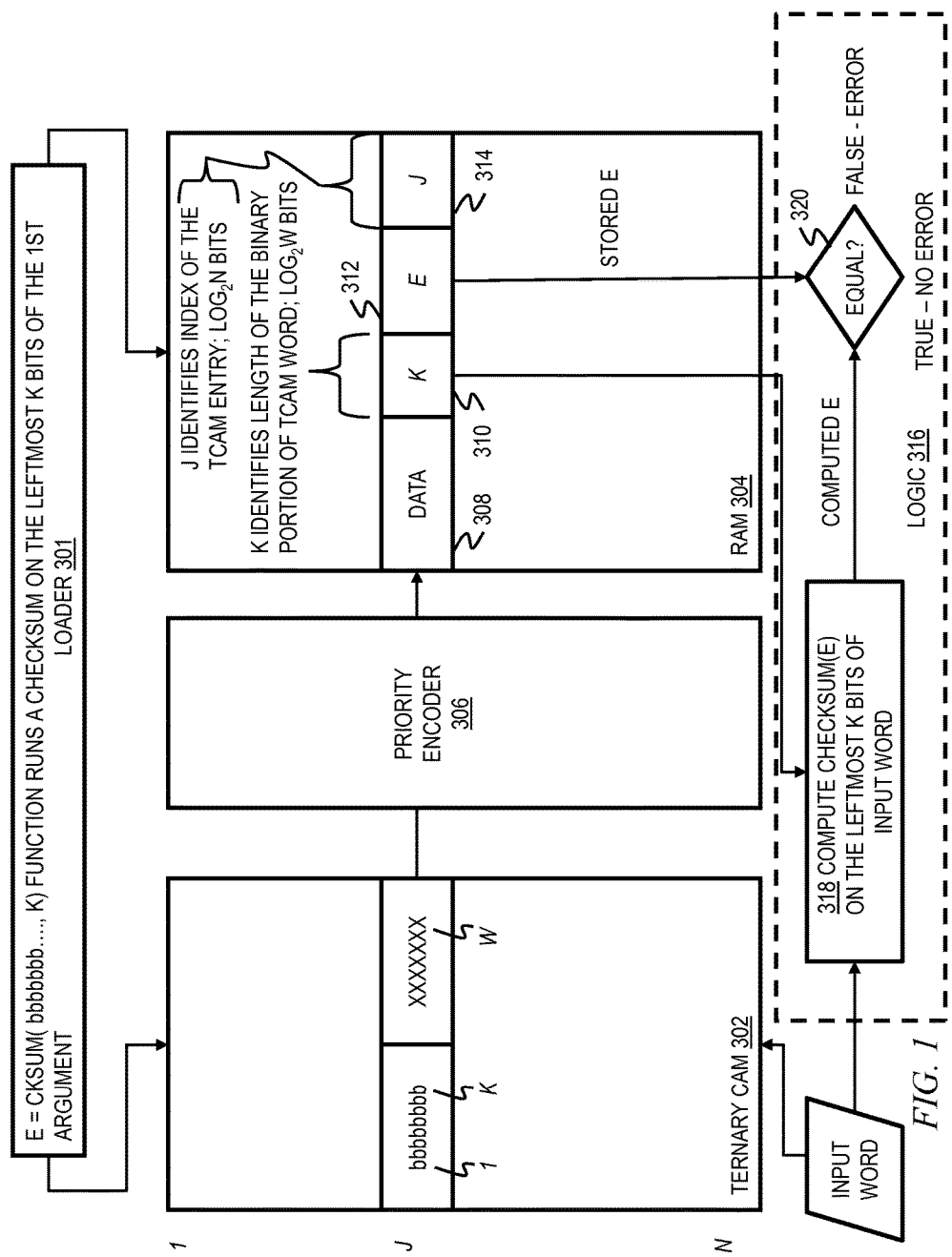
FIG. 1 shows a concurrent TCAM error detection scheme, in accordance with an aspect of the invention.

Indeed, one or more embodiments provide a concurrent TCAM error detection scheme; e.g., concurrent error detection in a TCAM array. Referring to FIG. 1, one exemplary embodiment relies on the insight that "don't care" (X) digits will be to the right hand side of the ternary word in many TCAM applications. In particular, TCAM 302 includes N words 1 to N. The $J^{th}$ word includes W bits total with leftmost K bits 1 through K which have values of zero or one (in the non-limiting example of FIG. 1, K=8 and W=15); the remaining seven rightmost bits are "don't care" bits. In one or more embodiments, the Huffman decode will have this form and a translation lookaside buffer (TLB) and network applications are also likely to have the same ternary form.

One or more embodiments also append additional error detection information 310, 312, 314 to the corresponding RAM entry 308 in RAM 304, as will be discussed further below.

One or more embodiments detect only false positives (false hits). False hits are more pertinent than false misses, as will also be discussed further below.

One or more embodiments require no changes to existing TCAM array circuitry One or more embodiments employ additional RAM bits 310, 312, 314 and external random logic to encode and decode error check bits. FIG. 1 depicts additional RAM bits 310, 312, and 314 in a RAM 304 separate from the TCAM 302. Logic 316 external to elements 302, 304 processes fields 310, 312, 314 on a TCAM lookup. In the simple case of E being a parity bit, this external logic is a parity check on bits 1-K. Continuing to refer to FIG. 1, logic 316 takes the input word to the TCAM 302 and applies K to determine error detection checksum CKSUM(E) at 318. In decision block 320, this computed E is compared to the stored value of E 312 retrieved from the RAM of the TCAM entry that matched the query. If the two are equal, there is no error (TRUE branch). If the two are not equal, there is an error (FALSE branch).

Again, unlike current techniques, one or more embodiments carry out concurrent (real time) error detection.

As shown in FIG. 1, loader 301 encodes the $J^{th}$ word in TCAM 302 into a corresponding entry in RAM 304 including the DATA 308 as well as the additional appended error detection information 310, 312, 314. "DATA" 308 is the data that the TCAM 302 outputs for a match on word J. For example, in a TLB entry there are the high-order Virtual Address bits (VA) that are matched on a look-up, and the TLB outputs the Real Address (RA) of the matching entry. The RA corresponds to "DATA" in FIG. 1, while the VA corresponds to the "bbbb . . . b" portion. Regarding information 310, K identifies the length of the binary portion of the TCAM word; it contains CEILING($\log_2$W) bits (that is to say, round up). For example, with W=15, binary 00001111, $\log_2$W is rounded up to integer 4. Regarding information 312, the checksum function E, E=CKSUM (bbbbbbb . . . , K), runs a checksum on the leftmost K bits of the 1st argument. Here, the first argument is the binary match value in the TCAM entry that one cares about (the XXX . . . X are don't care ternary values). See above comment regarding TLB. Regarding information 314, J identifies the index of the TCAM entry; it contains CEILING($\log_2$N) bits. For example, with N=512, binary 000000100000000, $\log_2$N is integer 9 bits.

Figure 4:
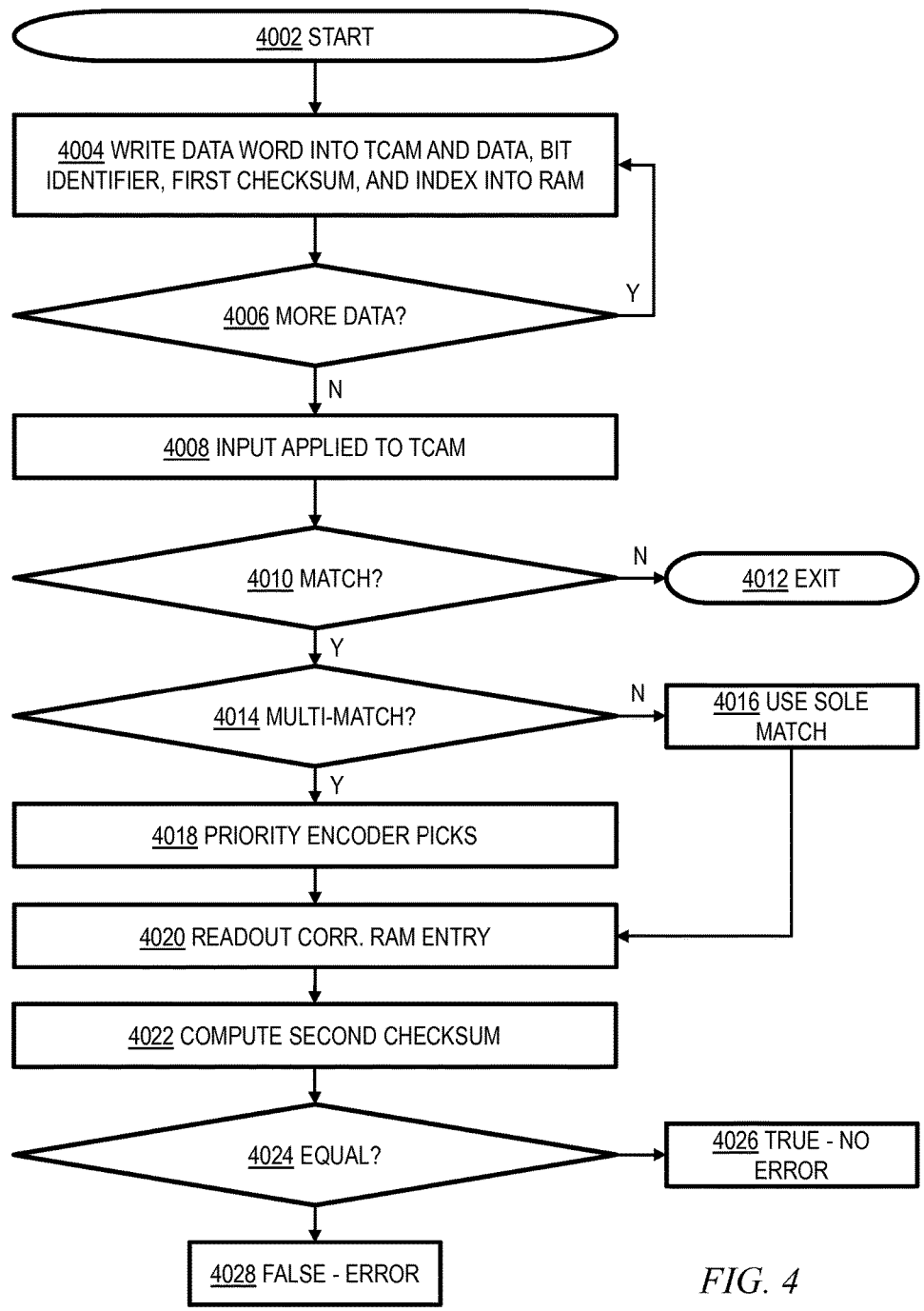
FIG. 4 shows a flow chart of an exemplary method, according to an aspect of the invention.

Consider now a suitable TCAM write algorithm, and refer to the flow chart of FIG. 4, which begins at 4002. Regarding step 4004, at the time of TCAM write, compute a first checksum E on the binary portion bbbbbbb of the ternary word. For the convenience of checksum implementation, "X" digits may be replaced with zeroes. Given the teaching herein, the skilled artisan will be able to choose a suitable error detecting scheme for the checksum—examples include: single bit parity, CRC, and the like. Along with the RAM data 308, also store:

- the length of the binary portion K of the ternary word 310 (more generally, some identifier of which bits are "don't cares" and which have significant binary values).
- Checksum E 312,
- (optionally) TCAM location index J 314 which provides the location of the matching entry which can be used to locate the erroneous entry.

As compared to current techniques, this approach requires an additional $\log_2 W + \log_2 N + $ check bit(s) in the RAM array, e.g. 4+9+1=14 additional bits for error detection for a 16-digit ternary word, 512-entry TCAM and single bit parity.

As indicated by decision block 4006, continue the writing process until all desired data has been loaded.

Consider now a suitable TCAM query algorithm. In step 4008 query the TCAM 302 with the input word INP; INP has binary digits; no Xs are allowed. If there is no match (decision block 4010 yields a NO), exit as in step 4012. If the query hits one or more entries (decision block 4010 yields a YES), determine in decision block 416 if there are multiple hits. If so, priority encoder 306 resolves this in step 4018 into precisely one matching entry at address J. In case of only a single hit, use that sole match as in step 4016. In step 4020, RAM 304 outputs the DATA 308, if present, as well as the error detection bits K, E, and J (if present). In step 4022, compute the second checksum (i.e., on INP), and in step 4024, test for the following condition: CKSUM(INP, K) !=E, where "!=" is the Boolean NOT EQUAL operator. If equal, there is no error, as per step 4026. If not equal, then an error has been detected as per 4028 in the binary bbbbbbb portion of the stored ternary word at location J.

One or more embodiments only detect false hits, also called "false positive" herein. For example, if the query is bbbbbXXXX and what is returned is bbebbXXXX (i.e., a false hit; "e" is the bit in error in the TCAM word), this will be detected. On the other hand, in the case of an error in a "don't care" bit, such as if the query is bbbbbXXXX and what is returned is bbbbbXeXX, this may not be detected (i.e., a false miss). One or more embodiments provide instantaneous error detection for any application needing protection for false hits. Protection against false hits is more important than false misses in many applications. In the TLB and network applications, false hits would be security exposures giving access to pages not allowed, or sending packets to unintended ports. In the Huffman decode case, a false hit will cause a multi-match, and in the worst case may corrupt the decoded data (which can be detected later with CRC).

False misses on the other hand are not detected but they are less problematic. In the TLB application, a false miss will cause a TLB reload from the page table, in principle correcting the error. In the Network application a false miss will cause packets to be dropped; typically a higher level application can retransmit lost packets to recover from the error. In the Huffman decode case, due to the prefix-free property, a false miss will return "the code word not found in this table" error, which instantly flags the application using the Huffman decode to abort.

Now consider exemplary error modes. Assume the following error transitions, where the values in parentheses are the internal representation of Ternary logic values. With a single bit error assumption, the 0↔1 transition is not possible. The only error which produces a false positive is zero or one to X error. Also introduced is an unused state called Y. It will produce either match or mismatch depending on the TCAM logic; either case is covered as per the discussion above.

0=(0,1)→single bit error leads to one of X,Y
1=(1,0)→single bit error leads to one of X,Y
X=(0,0)→single bit error leads to one of 0,1
Y=(1,1) undefined; this combination of state is not used.
  If because of bit error it is present, it is considered to be an error. Using the same reasoning as above, it causes a false miss, which is less problematic than a false hit.

Consider now an exemplary use of the embodiment of FIG. 1. Huffman codes are variable length codes. A compressed data stream may contain concatenation of multiple Huffman codes with no delineating markers between the symbols. A TCAM 302 as shown in FIG. 1 may decode Huffman coded data streams. In a non-limiting example, suppose that literal symbols A, B, C, D are represented by the Huffman codes 0, 10, 110, and 111 respectively. Note that the codes have bit lengths of 1, 2, 3, and 3 bits respectively. Suppose a compressed data stream includes the symbols in sequence:

ABABDCA . . . .

However, since the sequence is Huffman coded, the stream includes the bits:

0 10 0 10 111 110 0;

with spaces inserted for the sake of explanation; in practice the coded data stream will have no spaces:

0100101111100.

Figure 3:
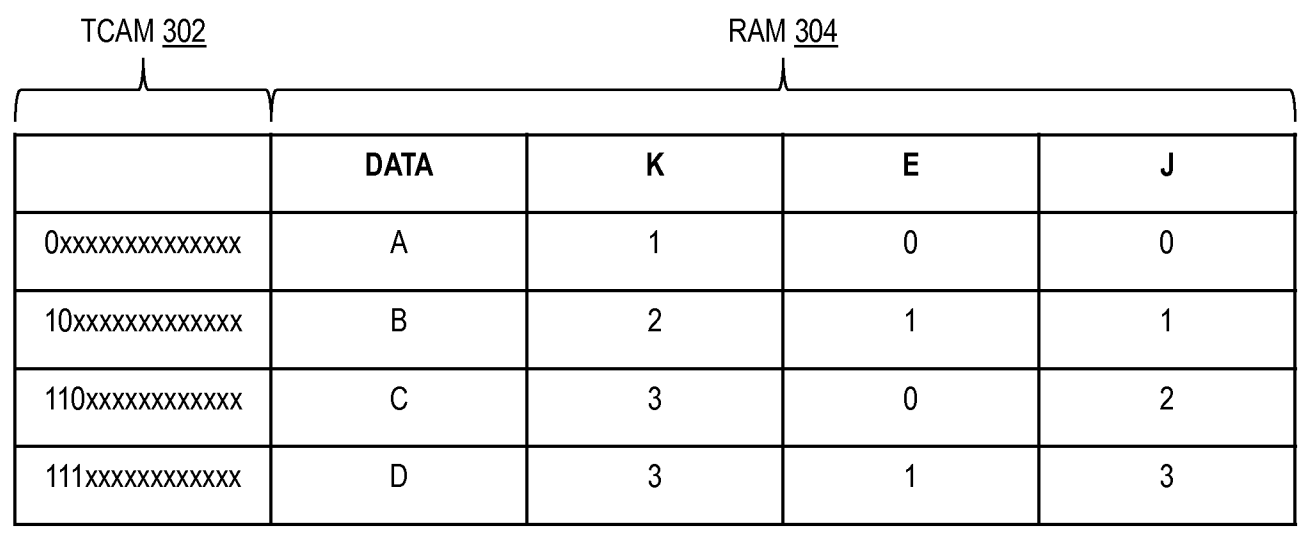

It is the job of the TCAM 302 in this example to delineate the codes in this bit stream and recover the literal symbols A, B, C, D from the binary stream. As such, the decoder would have loaded the TCAM with the codes and their corresponding symbols according to the format of FIG. 1. This is shown in the table of FIG. 3. Here, each TCAM entry contains a 15 bit ternary coded word, where X represents the ternary "don't care" symbol that TCAM 302 matches as true for any given TCAM input bit value 0 or 1. The data fields contain the literal symbols A, B, C, D respectively. The K field indicates the bit length of each Huffman coded word on the left. The E field in this example is an even parity check of the 15 bit ternary word; as stated before for the convenience of implementation, an X bit may be assumed as 0 for the purposes of the parity calculation. Finally, the J field contains the TCAM row indices of the entries A, B, C, D in this non-limiting example.

Supposing the sequence 0100101111100 is to be decoded by this table. The initial input sequence is supplied to TCAM 302 in Step 1 as shown below. Notice that the only matching row in this example is the first row, in essence the first bits of the input and the row entry 0xxxx . . . do match. Then the RAM portion 304 outputs the data:

A 1 0 0.

This is, namely, the literal symbol A, and its length of 1 bit. Now that the decoder knows that the first Huffman code is 1 bit long, it shifts the input sequence to the left by 1 bit in Step 2 and repeats the procedure. This time the second row, namely:

B 2 1 1 is output from the RAM, which also indicates that the code B is 2 bits in length. Therefore, in Step 3, the decoder shifts the input by 2 bits to get the next code. The input now matches the 1st row again, namely the literal A. Note that the decoder has already extracted the sequence A B A from the coded input stream (refer to the sequence above). Therefore, the decode process continues in this fashion until all the input bits are consumed.

Continue to refer to FIG. 3.
0100101111100XX<<<<input outputs>>>>A 1 0 0 (matching 1st row, code 1 bit long) Step 1
shift left 1 bit
100101111100XXX<<<<input outputs>>>>B 2 0 0 (matching 2nd row, code 2 bit long) Step 2
shift left 2 bits
0101111100XXXXX<<<<input outputs>>>>A 1 0 0 (matching 1st row, code 1 bit long) Step 3

Now suppose a bit error has occurred in TCAM 302. In a first error scenario, suppose one of the ternary X bits in the 1st row has a single bit error: an X has erroneously become the binary value 1 as shown below in the 3$^{rd}$ column:
0x1xxxxxxxxxxxxx A 1 0 0
and the input in Step 1 is:
0100101111100XX<<<<input When the input is presented to TCAM 302, it will produce no match, because there is no TCAM row that matches the input anymore. Therefore, the TCAM-based decoder will abort the decode process as no code has been found. Thus, an erroneous result has been avoided (referred to as "false miss" elsewhere herein).

In the second error scenario (false hit), suppose the 3$^{rd}$ row 1$^{st}$ bit has erroneously flipped and has become an X as shown:
x10xxxxxxxxxxxx C 3 0 2
and suppose decoder is doing Step 1:
0100101111100XX<<<<input In this case, both the 1$^{st}$ and 3$^{rd}$ rows would match the input. If the TCAM logic has a multimatch signal, the decoder would have aborted the decode process as it is not permitted in the Huffman decoder application. In the absence of a multimatch output signal, one embodiment of a TCAM could output either one of the two matched rows. If the 1$^{st}$ row is output then the decode would be successful. If the 3$^{rd}$ row is output, then the decoder would flag that output as erroneous, because the K field says that the code is 3 bits long and therefore the decoder computes the even parity over the leftmost 3 bits of the input EVENPARITY (010)=1 which does not match the stored parity E=0, again flagging the result as erroneous. Some TCAM implementations output logical OR all the fields in case of a multimatch. The output values may be nonsensical values; for example nonexistent literal symbols. To ensure error detection in those cases, instead of a simple 1 bit parity, one would use stronger error codes in the E column.

Figure 2:
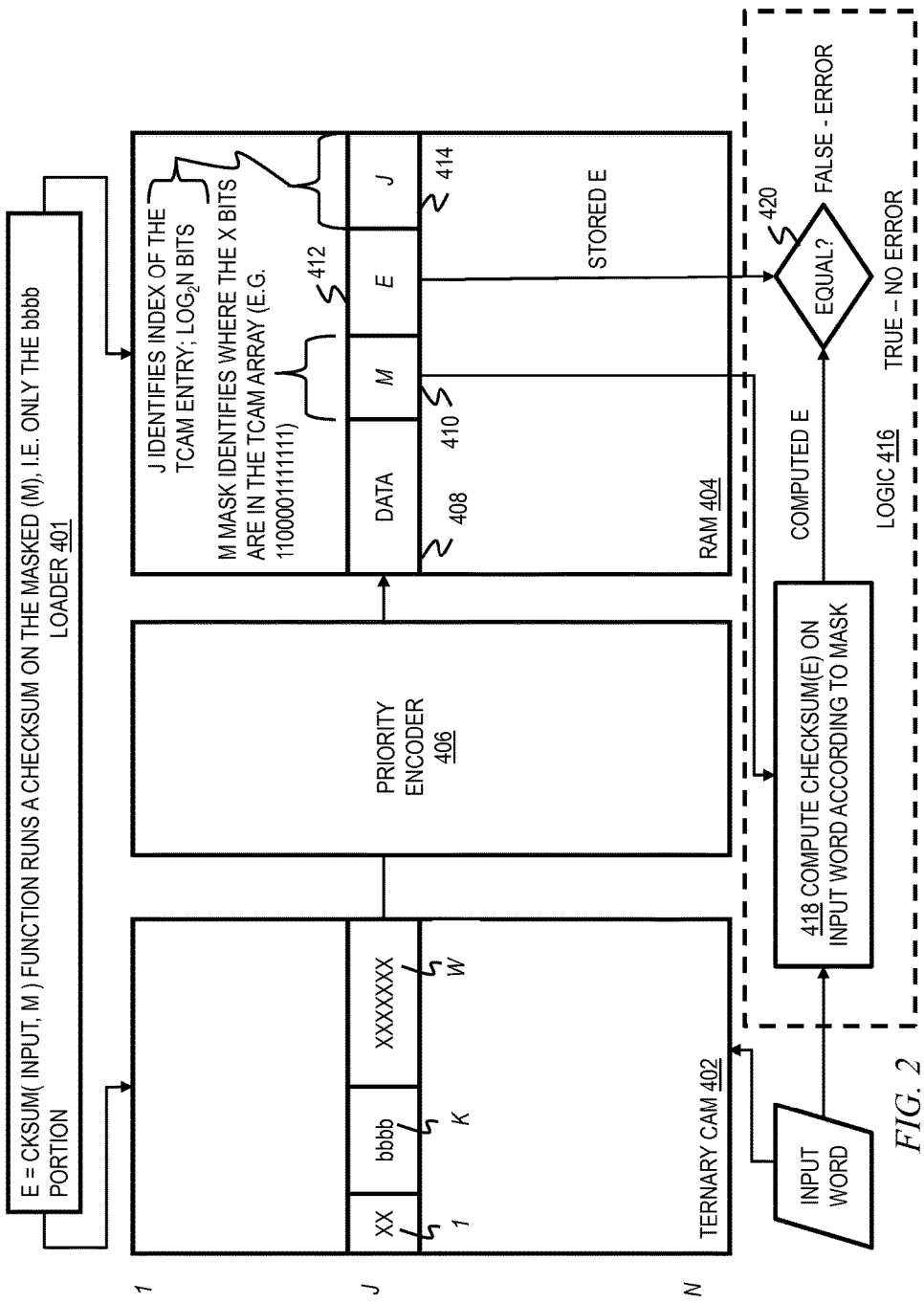
FIG. 2 shows an alternative embodiment of a concurrent TCAM error detection scheme, in accordance with an aspect of the invention.

FIG. 2 shows an alternative embodiment. Advantageously, the embodiment of FIG. 2 allows don't care bits X to be in any column, albeit at the expense of using more RAM bits (RAM bits are cheaper than TCAM bits). Similar to the embodiment of FIG. 1, the embodiment of FIG. 2 provides concurrent error detection (real time), detects only false hits, and does not require any changes to the TCAM circuits (can be implemented using existing TCAM array circuitry).

TCAM 402 includes N words 1 to N. The J$^{th}$ word includes W bits total with leftmost K bits 1 through K which may have values of zero or one and in this embodiment may also have don't care bits (in the non-limiting example of FIG. 2, K=6 and W=13); the seven rightmost bits are "don't care" bits.

As shown in FIG. 2, loader 401 encodes the J$^{th}$ word in TCAM 402 into a corresponding entry in RAM 404 including the data 408 as well as the additional appended error detection information 410, 412, 414. "DATA" 408 is the data that the TCAM 402 outputs for a match on word J. For example, in a TLB entry there are the high-order Virtual Address bits (VA) that are matched on a look-up, and the TLB outputs the Real Address (RA) of the matching entry. The RA corresponds to "DATA" in FIG. 2, while the VA corresponds to the "bbbb . . . b" portion with two most significant and seven least significant bits specified as X. Regarding information 410, M mask identifies where the X bits are in the TCAM array (e.g. 1100001111111) in the example shown, indicating that the first, second, and seventh through thirteenth bits are X bits. Regarding information 412, the checksum function E, E=CKSUM(INPUT, M) function runs a checksum on the masked (M) INPUT, i.e. only the bbbb portion of the input. Regarding information 414, J identifies the index of the TCAM entry; it contains log$_2$N bits. For example, with N=512, log$_2$N is 9 bits.

The write and query processes are the same for the second embodiment in FIG. 2 as for the first embodiment in FIG. 1. Priority encoder 406 resolves multi-matches as described above for the first embodiment. Logic 416 carries out computation of the second checksum in step 418 (here using the mask value) and checks for equality with the first checksum in block 420.

Regarding TCAM array requirements, in a non-limiting example, the CAM array width is determined as follows. Reference is made to DEFLATE, a data compression algorithm that uses a combination of the LZ77 algorithm and Huffman coding, as specified in RFC 1951. The following example refers to the Huffman decoder defined in the DEFLATE RFC1951. A 16b TCAM match field is required.

Deflate max bit sequence length=15 bits;
1 bit Literal/Length vs Distance selector;
Total TCAM width=16 digits.

The TCAM entries are as follows:
288 Literal/Length+32 Distance symbols=320 entries→512 TCAM entries (rounding up to the next power of 2; the other parameters come from DEFLATE).

Consider the RAM width. Regarding symbols, there are nine bits for 288 literal/length symbols, five bits for distance symbols, and a one-bit prefix to distinguish literal/length from distance. Thus, there are MAX(9,5)+1=10 bits to identify symbols.

Regarding shift values, the maximum bit-length of the CAM word (Huffman code) is fifteen, and thirteen extra bits are used for the distance codes. Thus, 15+13=28 bits. Therefore, input may be shifted by 28 positions or less→log$_2$(28)=5 bits of shift value stored in the RAM entry. There are thus a total=10+5=15 bits for RAM excluding error detection.

One or more embodiments add concurrent error detection thus the RAM word width is log$_2$W+log$_2$N+error check bits. Allocating three bits for concurrent error detection, the RAM word adds log$_2$ 16 digit wide CAM+log$_2$ 512+3 check bits=16 bits (logs are to base 2, ordinary arithmetic addition 4+9+3=16).

Thus, the total RAM width is 15+16=29 bits; rounding up to the nearest power of 2 implies a 32 bit wide RAM.

In summary, the exemplary TCAM size is 512×{16 TCAM digits,32 RAM bits}.

Multimatch will not occur in the non-error case, but may occur in the error case. Multimatch due to false positives should not damage a TCAM. Preferably, multimatch should return one of the matched results.

Conventional error detecting and correcting codes (ECC) for SRAM and DRAM devices are typically not applicable to Ternary Content Addressable Memories (TCAM). The contents of TCAMs are retrieved not by address but by input data. As such, the input word is searched in parallel in the TCAM array, accessing entire TCAM rows at once, which makes it impractical to use conventional ECC logic. Current TCAM error detection techniques include background error detection and correction by scrubbing; coding of ternary words (0,1,X) in the TCAM array; and/or substantially changing TCAM circuitry to detect and correct errors.

One or more embodiments advantageously provide a method for concurrent error detection in a TCAM array where false positives are identified immediately on access and without having to change the internal organization of the TCAM circuitry. One or more embodiments take advantage of the application-specific nature of the TCAM contents;

namely, the fact that in many TCAM applications the binary 0,1 values in a TCAM stored word will be found in the leftmost bits of the word and the "don't care (X)" values will be found in the rightmost bits of the word. An error detecting code is applied to the binary leftmost bits of the word. The resulting error detecting checksum is also stored in the RAM portion of the corresponding TCAM entry along with the length of the binary portion and the index of the TCAM row, which will be later used for computing a checksum for the input data and for identifying an erroneous entry. When input data is queried in the TCAM and it matches one of the TCAM entries, the resulting RAM data is retrieved, which includes the previously stored checksum, length of the binary portion of the stored word, and the TCAM row index. The error detecting algorithm is applied to the input word as was done for the TCAM word stored earlier. If the two checksums mismatch it is an indication of a false positive due to an error in the TCAM array. The erroneous entry may be replaced using the row index also retrieved as part of the input query. One or more embodiments are inexpensively implemented external to the TCAM, without having to change the internal organization of the TCAM circuity.

One or more embodiments do not require two dimensional search capability.

One or more embodiments do not require a CAM to be put in a special mode when the CAM is idle where no comparisons are made; one or more embodiments provide concurrent (real time) error detection instead.

Concurrent (real time) error detection techniques in accordance with aspects of the invention advantageously do not require periodic scanning of the TCAM and do not require a separate test sequence to detect errors.

One or more embodiments are implemented using hardware storage elements, digital logic hardware, and optionally software running on a general-purpose processor. The logic and storage aspects described herein can be implemented by the skilled artisan on any known family of digital logic circuitry and using known storage elements.

Given the discussion thus far, it will be appreciated that, in general terms, an exemplary method, in accordance with an aspect of the invention, includes the step 4004 (repeated as needed as indicated by decision block 4006) of writing a plurality of data words into a ternary content-addressable memory 302 or 402. Each of the data words has binary digits and don't-care(X) digits. The skilled artisan will appreciate that this step involves TCAM 302, 402 which is a piece of hardware. The writing into the TCAM is carried out by loader 301, 401. The loader could be, for example, software doing writes into the memory; a hardware state machine loading the TCAM from some memory or some network; or the like. For example, suitable hardware copies the data from a dynamic random access memory (DRAM) which could have been loaded by the software or state machine just described. That is to say, one non-limiting example is a hardware load from a DRAM, which DRAM could have in turn been loaded by software running on a general purpose processor; a state machine implemented in digital logic circuitry, etc.

Still referring to steps 4004 and 4006, a further step includes, contemporaneous with the writing, for each of the plurality of data words, calculating a first checksum 312, 412 on the binary digits; and storing, in a corresponding portion of a random-access memory 304, 404, a data portion (optional) of a corresponding one of the data words (DATA 308, 408); an identifier of the binary digits of the corresponding one of the data words (K or mask); and the first checksum 312, 412 for the corresponding one of the data words. This step can also be carried out by the loader 301, 401. For example, loader software calculates K, E, and J. The software that is loading up the TCAM has a counter 1, 2, 3, . . . J . . . N in sequential entries in the TCAM. For every bbb bits it is storing, it creates K and E and it knows J because that is the index it is using to iterate through loading the TCAM. The same is true if the loader is a hardware state machine. In the embodiment of FIG. 2, the mask value is used instead of K.

A further step 4008 includes querying the ternary content-addressable memory 302, 402 into which the plurality of data words have been written with an input word. This step can be carried out, for example, by the loader entity that does the writing or could be another hardware entity e.g. a hardware state machine such as a Huffman decoder seeking to decode Huffman-encoded input streams. For example the entity gets an input datum and supplies it to the TCAM and sees what the answer is. If a false positive is returned, this other hardware entity (e.g. a hardware state machine such as a Huffman decoder) decides what to do about the error. In the non-limiting example above, it terminates decoding. The state machine that does the querying can be the same or different than the state machine that does the loading.

A still further series of steps can be carried out by logic 316, 416, implemented in hardware. Upon the querying yielding a match (YES branch of block 4010,with any multi-hits resolved as described), in step 4020, retrieve from the random-access memory corresponding values of the data portion (optional), the identifier of the binary digits, and the first checksum; in step 4022, compute a second checksum on the input word, using the identifier of the binary digits; and in decision block 4024, if the second and first checksums are not equal, determine in real time that the match is a false positive as indicated at 4028.

Optionally, step 4004 includes storing row index J for the corresponding one of the data words, identifying a row in the ternary content-addressable memory 302, 402 where the corresponding one of the data words is stored; and retrieving step 4020 further includes retrieving a corresponding value of the row index. A further step in this case includes replacing the erroneous entry using the row index. That is to say, overwrite the error row with the data word entry J correct value to eliminate the bit error. The correct value is obtained from the loader that loaded the TCAM to begin with. Consider a TLB—the part in the TCAM will be some bits of the virtual address. The part that is the data in the RAM will be the real address after the translation. There will be a valid bit associated with the virtual address. It is probably not in the TCAM; it may be in the RAM; it may be stored in a separate latch. One response to an error is to change the valid bit from one to zero so that entry is no longer valid and it is not going to match when the TCAM is queried. The program that wanted that address translation for a memory access is going to receive a TLB miss. In the resolution of the TLB miss, the loader will re-compute the virtual address to real address mapping and will (re)write that entry back to the TCAM. Note for accuracy that DATA 308,408 is not exactly the same thing as the plurality of data words initially written into the TCAM.

Referring to the first embodiment of FIG. 1, in some cases, in the storing step 4004, the identifier of the binary digits of the corresponding one of the data words includes a length (K) of a left-most binary portion of the corresponding one of the data words; and the computing of the second checksum includes computing the second checksum on the left-most binary portion of the input word.

Referring to the second embodiment of FIG. 2, in some cases, in the storing step, the identifier of the binary digits of the corresponding one of the data words includes a mask (M) identifying a binary portion of the corresponding one of the data words; and the computing of the second checksum includes computing the second checksum on a binary portion of the input word, determined from the mask.

M masks off the bits that correspond to the Xs in the TCAM word. The input query word is all binary but the bits corresponding to Xs in the TCAM word are masked off for the purposes of computing the second checksum.

The checksum can be, for example, a parity check.

Furthermore, given the discussion thus far, it will be appreciated that an exemplary apparatus, according to another aspect of the invention, includes a ternary content-addressable memory array 302 402; a random access memory array 304, 404; and a loader 301, 401 coupled to the ternary content-addressable memory array and the random access memory array. Also included is a querying entity coupled to the ternary content-addressable memory array; and a matching logic module 316, 416 coupled to the random access memory array. The elements are cooperatively configured to carry out the method steps as described herein.

As indicated elsewhere, the loader can be, for example, a software program tangibly embodied in a non-transitory computer-readable medium executing on at least one hardware processor, or a hardware state machine.

The querying entity can be the same entity as the loader or could be separate; for example, a hardware state machine separate and distinct from the loader. The latter case is not illustrated to avoid cluttering the drawings. In a non-limiting example, the querying entity includes a Huffman decoder.

In one or more embodiments, a priority encoder 306, 406 coupled to the ternary content-addressable memory array and the random access memory array is configured to, upon the querying yielding multiple putative matches, resolve same to obtain the match. The priority encoder can be implemented, for example, using digital logic circuitry. Thus, the priority encoder addresses the issue that arises when more than one entry in the TCAM matches—the priority encoder decides which one to report—it usually reports the one with the lowest index, but this is a non-limiting example.

At least a portion of one or more embodiments of the invention, or elements thereof, can be implemented in the form of an apparatus including a memory and at least one processor that is coupled to the memory and operative to perform exemplary method steps.

Figure 5:
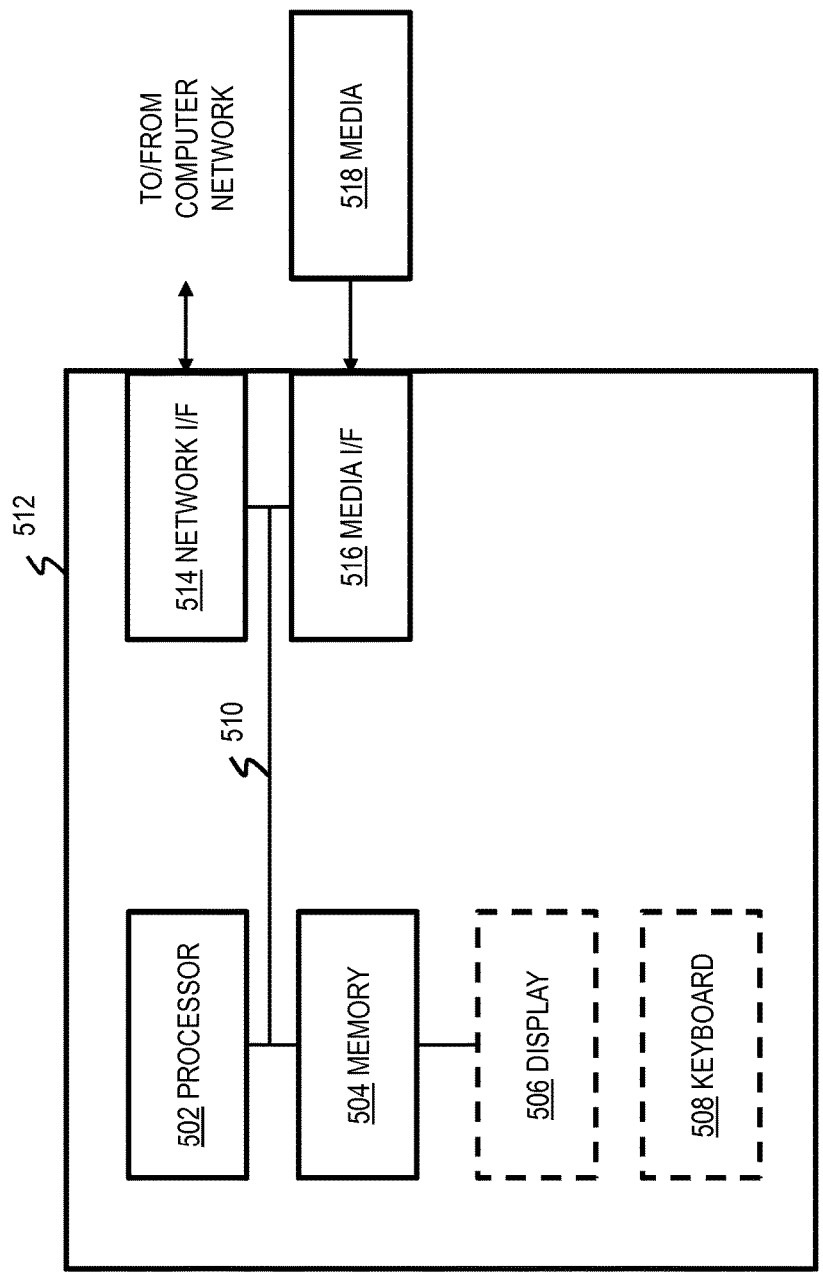
FIG. 5 depicts a computer system that may be useful in implementing at least a portion of one or more aspects and/or elements of the invention.

One or more embodiments can make use of software running on a general purpose computer or workstation. With reference to FIG. 5, such an implementation might employ, for example, a processor 502, a memory 504, and an input/output interface formed, for example, by a display 506 and a keyboard 508. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 502, memory 504, and input/output interface such as display 506 and keyboard 508 can be interconnected, for example, via bus 510 as part of a data processing unit 512. Suitable interconnections, for example via bus 510, can also be provided to a network interface 514, such as a network card, which can be provided to interface with a computer network, and to a media interface 516, such as a diskette or CD-ROM drive, which can be provided to interface with media 518.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 502 coupled directly or indirectly to memory elements 504 through a system bus 510. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 508, displays 506, pointing devices, and the like) can be coupled to the system either directly (such as via bus 510) or through intervening I/O controllers (omitted for clarity).

Network adapters such as network interface 514 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 512 as shown in FIG. 5) running a server program. It will be understood that such a physical server may or may not include a display and keyboard.

It should be noted that any of the methods described herein can include an additional step of providing a system comprising distinct software modules embodied on a computer readable storage medium; the modules can include, for example, any or all of the elements depicted in the block diagrams or other figures and/or described herein as being implemented by software. The method steps can then be carried out using the distinct software modules and/or sub-modules of the system, as described above, executing on one or more hardware processors 502. Further, a computer program product can include a computer-readable storage medium with code adapted to be implemented to carry out one or more method steps described herein, including the provision of the system with the distinct software modules.

Exemplary Integrated Circuit Details

One or more embodiments as described herein can be implemented, at least in part, using integrated circuit chips. The integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

Exemplary System and Article of Manufacture Details

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   writing a plurality of data words into a ternary content-addressable memory, each of said data words having binary digits and don't-care digits;
   contemporaneous with said writing, for each of said plurality of data words:
       calculating a first checksum on said binary digits;
       storing, in a corresponding portion of a random-access memory:
           an identifier of said binary digits of said corresponding one of said data words, wherein said identifier includes a length of said binary digits; and
           said first checksum for said corresponding one of said data words;
   querying said ternary content-addressable memory into which said plurality of data words have been written with an input word;
   upon said querying yielding a match:
       retrieving from said random-access memory, corresponding values of said identifier of said binary digits and said first checksum;
       computing a second checksum on said input word, using said identifier of said binary digits; and
       determining in real time that said match is a false positive upon detecting that said second and first checksums are not equal.

2. The method of claim 1, wherein:
   said storing further comprises storing, in said corresponding portion of said random-access memory, a data portion of a corresponding one of said data words; and
   said retrieving further comprises retrieving, from said random-access memory, a corresponding value of said data portion.

3. The method of claim 2, wherein:
   said storing further comprises storing a row index for said corresponding one of said data words, identifying a row in said ternary content-addressable memory where said corresponding one of said data words is stored; and
   said retrieving further comprises retrieving a corresponding value of said row index;

further comprising replacing said erroneous entry using said row index.

4. The method of claim 3, wherein:
   in said storing step, said identifier of said binary digits of said corresponding one of said data words comprises said length of said binary digits, wherein said length of said binary digits is of a left-most binary portion of said corresponding one of said data words; and
   said computing of said second checksum comprises computing said second checksum on said left-most binary portion of said input word.

5. The method of claim 3, wherein:
   in said storing step, said identifier of said binary digits of said corresponding one of said data words comprises a mask identifying a binary portion of said corresponding one of said data words; and
   said computing of said second checksum comprises computing said second checksum on a binary portion of said input word, determined from said mask.

6. The method of claim 1, wherein said checksum calculated in said calculating step comprises a parity check.

7. An apparatus comprising:
   a ternary content-addressable memory array;
   a random access memory array;
   a loader coupled to said ternary content-addressable memory array and said random access memory array;
   a querying entity coupled to said ternary content-addressable memory array; and
   a matching logic module coupled to said random access memory array;
wherein:
   said loader is configured to write a plurality of data words into said ternary content-addressable memory array, each of said data words having binary digits and don't-care digits;
   said loader is configured to, contemporaneous with said writing, for each of said plurality of data words:
       calculate a first checksum on said binary digits; and
       store, in a corresponding portion of said random-access memory array:
           an identifier of said binary digits of said corresponding one of said data words, wherein said identifier includes a length of said binary digits; and
           said first checksum for said corresponding one of said data words;
   said querying entity is configured to query said ternary content-addressable memory into which said plurality of data words have been written with an input word; and
   said matching logic module is configured to, upon said querying yielding a match:
       retrieve from said random-access memory array corresponding values of said identifier of said binary digits and said first checksum;
       compute a second checksum on said input word, using said identifier of said binary digits; and
       determine in real time that said match is a false positive upon detecting that said second and first checksums are not equal.

8. The apparatus of claim 7, wherein:
   said loader is further configured to, contemporaneous with said writing, for each of said plurality of data words, store, in said corresponding portion of said random-access memory, a data portion of said corresponding one of said data words; and said matching logic module is further configured to, upon said querying yielding a match, retrieve, from said random-access memory, a corresponding value of said data portion.

9. The apparatus of claim 8, wherein:
said loader further stores in said random access memory array a row index for said corresponding one of said data words, identifying a row in said ternary content-addressable memory array where said corresponding one of said data words is stored;
said matching logic module retrieves a corresponding value of said row index; and
said loader is further configured to replace said erroneous entry using said row index.

10. The apparatus of claim 9, wherein:
said identifier of said binary digits of said corresponding one of said data words comprises said length of said binary digits, wherein said length of said binary digits is of a left-most binary portion of said corresponding one of said data words; and
said matching logic module computes said second checksum on said left-most binary portion of said input word.

11. The apparatus of claim 9, wherein:
said identifier of said binary digits of said corresponding one of said data words comprises a mask identifying a binary portion of said corresponding one of said data words; and
said matching logic module computes said second checksum on a binary portion of said input word, determined from said mask.

12. The apparatus of claim 8, wherein said loader comprises a hardware state machine.

13. The apparatus of claim 8, wherein said loader comprises a software program tangibly embodied in a non-transitory computer-readable medium executing on at least one hardware processor.

14. The apparatus of claim 8, wherein said querying entity and said loader are identical.

15. The apparatus of claim 8, wherein said querying entity comprises a hardware state machine separate and distinct from said loader.

16. The apparatus of claim 8, wherein said querying entity comprises a Huffman decoder.

17. The apparatus of claim 8, further comprising a priority encoder coupled to said ternary content-addressable memory array and said random access memory array, said priority encoder being configured to, upon said querying yielding multiple putative matches, resolve same to obtain said match.

18. The apparatus of claim 7, wherein said checksum calculated by said loader comprises a parity check.

19. A non-transitory computer readable medium comprising computer executable instructions which when executed by a computer cause the computer to perform the method of:
writing a plurality of data words into a ternary content-addressable memory, each of said data words having binary digits and don't-care digits;
contemporaneous with said writing, for each of said plurality of data words:
calculating a first checksum on said binary digits;
storing, in a corresponding portion of a random-access memory:
an identifier of said binary digits of said corresponding one of said data words, wherein said identifier includes a length of said binary digits; and
said first checksum for said corresponding one of said data words;
querying said ternary content-addressable memory into which said plurality of data words have been written with an input word;
upon said querying yielding a match:
retrieving from said random-access memory, corresponding values of said identifier of said binary digits and said first checksum;
computing a second checksum on said input word, using said identifier of said binary digits; and
determining in real time that said match is a false positive upon detecting that said second and first checksums are not equal.

* * * * *